US012753366B2

(12) United States Patent
Nishijima et al.

(10) Patent No.: US 12,753,366 B2
(45) Date of Patent: Oct. 6, 2026

(54) CLEANING SOLUTION, METHOD FOR CLEANING SUBSTRATE, AND METHOD FOR MANUFACTURING SEMICONDUCTOR

(71) Applicant: TOKYO OHKA KOGYO CO., LTD., Kawasaki (JP)

(72) Inventors: Moe Nishijima, Kawasaki (JP); Kohei Serizawa, Kawasaki (JP); Emi Uchida, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 221 days.

(21) Appl. No.: 18/737,224

(22) Filed: Jun. 7, 2024

(65) Prior Publication Data

US 2025/0002818 A1 Jan. 2, 2025

(30) Foreign Application Priority Data

Jun. 23, 2023 (JP) ................................. 2023-103181

(51) Int. Cl.
*C11D 3/00* (2006.01)
*C11D 3/30* (2006.01)
*H10P 70/00* (2026.01)

(52) U.S. Cl.
CPC .............. *C11D 3/0073* (2013.01); *C11D 3/30* (2013.01); *H10P 70/277* (2026.01); *C11D 2111/22* (2024.01)

(58) Field of Classification Search
None
See application file for complete search history.

(56) References Cited

U.S. PATENT DOCUMENTS

2014/0264151 A1 9/2014 Ko

FOREIGN PATENT DOCUMENTS

JP 6751015 B2 9/2020
WO WO-2011145880 A2 * 11/2011 ........... C11D 3/3765
WO WO-2016084860 A1 * 6/2016 ............ H10P 50/642

* cited by examiner

*Primary Examiner* — Necholus Ogden, Jr.
(74) *Attorney, Agent, or Firm* — Knobbe Martens Olson & Bear LLP

(57) ABSTRACT

A cleaning solution, a method for cleaning a substrate, and a method for manufacturing a semiconductor. The cleaning solution includes at least one of a compound a1 represented by a general formula (a1), a salt of the compound (a1), a hydrate of the compound (a1), hydrogen iodide, borane, and a complex of the borane; an amine compound that has 4 or more carbon atoms and is not the compound a1, or a salt thereof; and an anticorrosive agent, (a1)

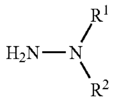

in which $R^1$ and $R^2$ each independently represents an organic group that does not contain a carbonyl group, or a hydrogen atom.

13 Claims, 2 Drawing Sheets

CLEANING SOLUTION, METHOD FOR CLEANING SUBSTRATE, AND METHOD FOR MANUFACTURING SEMICONDUCTOR

TECHNICAL FIELD

The present invention relates to a cleaning solution, a method for cleaning a substrate, and a method for manufacturing a semiconductor.

The present applications claims priority to Japanese Patent Application No. 2023-103181, filed Jun. 23, 2023, the entire content of which is incorporated herein by reference.

BACKGROUND ART

In a wiring substrate used in a semiconductor device, when a wiring layer is formed, there is a case where a liner layer, a barrier layer, or the like is provided adjacent to the wiring layer. As a material for forming these layers, the use of cobalt is being considered for next-generation wiring to lower resistance and improve embedding, etc.

For example, in a manufacturing process of a wiring substrate, planarization by chemical mechanical polishing (CMP), via formation, etc. are performed. After these steps, the substrate is cleaned to remove an impurity such as a shaving and the like adhering to the substrate. In connection with a cleaning solution used for such cleaning, for example, Patent Document 1 discloses an aqueous composition containing an organic base, a copper etching agent, an organic ligand, and a hydrazide compound as a cleaning composition used after CMP of a copper wiring substrate.

Patent Document

Patent Document 1—Japanese Patent No. 6751015.

SUMMARY OF THE INVENTION

However, there is still room for improvement in the above-mentioned cleaning solution. As an example, a wiring substrate that uses a noble metal such as copper, etc. as a wiring material and a base metal such as cobalt, etc. as a liner layer will here be described. Such a wiring substrate includes a wiring substrate in which a base metal-containing part and a noble metal-containing part are adjacent to each other. When such a wiring substrate is cleaned with a conventional cleaning solution, the corrosion potential difference between the base metal and the noble metal increases, and it is considered that galvanic corrosion and the like are likely to occur. From this viewpoint, there is a demand for the development of a cleaning solution with excellent anti-corrosion properties.

On the other hand, a cleaning solution is required to thoroughly remove residues generated in a manufacturing process such as etching, etc. from the substrate. From this viewpoint, the cleaning solution is also required to have excellent residue removal properties.

The present invention has been made in view of the above circumstances, and it is an object of the present invention to provide a cleaning solution, a method for cleaning a substrate, and a method for manufacturing a semiconductor, which can achieve both anti-corrosion properties and residue removal properties at high levels.

As a result of intensive studies to achieve the above object, the present inventors have found that the above problems can be solved by a cleaning solution, containing: at least one compound (A) selected from the group consisting of a compound a1 with a specific structure, a salt of the compound a1, a hydrate of the compound a1, hydrogen iodide, borane, and a complex of the borane; an amine compound that has 4 or more carbon atoms and is not the compound a1, or a salt thereof (B); and an anticorrosive agent (C), and not containing: an alkylamine having 1 to 3 carbon atoms, a hydroxylamine, tris(2-hydroxyethyl)methylammonium hydroxide (THEMAH), cetyl trimethylammonium hydroxide (CTAH), or choline.

That is, the present invention is as follows:

<1>

A cleaning solution, including: at least one compound (A) selected from the group consisting of a compound a1 represented by a general formula (a1), a salt of the compound a1, a hydrate of the compound a1, hydrogen iodide, borane, and a complex of the borane; an amine compound that has 4 or more carbon atoms and is not the compound a1, or a salt thereof (B); and an anticorrosive agent (C), in which the cleaning solution does not contain an alkylamine having 1 to 3 carbon atoms, a hydroxylamine, tris(2-hydroxyethyl)methylammonium hydroxide (THEMAH), cetyl trimethylammonium hydroxide (CTAH), or choline, (a1)

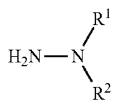

in which, $R^1$ and $R^2$ each independently represent an organic group that does not contain a carbonyl group, or a hydrogen atom.

<2>

The cleaning solution according to <1>, in which the compound (A) contains at least one selected from the group consisting of: a compound represented by the general formula (a1), in which $R^1$ and $R^2$ are each independently a hydrogen atom or an alkyl group, a salt thereof, and a hydrate thereof; a compound represented by the general formula (a1), in which $R^1$ is a hydrogen atom, and $R^2$ is $—R^3OH$, in which $R^3$ represents an alkylene group having 2 or more carbon atoms, a salt thereof, and a hydrate thereof; hydrogen iodide; and bis(pinacolato)diboron.

<3>

The cleaning solution according to <1> or <2>, in which the amine compound (B) contains at least one selected from the group consisting of: $H_2N—R^4—NH—R^5—OH$, in which $R^4$ and $R^5$ each independently represent an alkylene group having 2 or more carbon atoms; $H_2N—R^6—NH—R^7—NH_2$, in which $R^6$ and $R^7$ each independently represent an alkylene group having 2 or more carbon atoms; $HO—R^8—N(—R^9—OH)—R^{10}—OH$, in which $R^1$, $R^9$ and $R^{10}$ each independently represent an alkylene group having 2 or more carbon atoms; a tertiary amine; and a quaternary amine.

<4>

The cleaning solution according to <1> or <2>, in which the anticorrosive agent (C) contains at least one selected from the group consisting of: an imidazole ring-containing compound, a triazole ring-containing compound, a pyridine ring-containing compound, a pyrimidine ring-containing compound, a tetrazole ring-containing compound, a pyrazole ring-containing compound, a purine ring-containing compound, a phenanthroline ring-containing compound, a thiol-containing compound, a phosphonic acid-containing compound, and a phosphinic acid-containing compound.

<5>

The cleaning solution according to <1> or <2>, in which the cleaning solution is for cleaning a substrate that has a region in which a first metal atom-containing layer containing a cobalt atom and a second metal atom-containing layer containing a copper atom are in contact with each other, at least one of the first metal atom-containing layer and the second metal atom-containing layer being exposed on a surface of the substrate.

<6>

The cleaning solution according to <1> or <2>, in which the mass ratio of the content of the compound (A) and the content of the amine compound or a salt thereof (B) is from 20:1 to 1:30.

<7>

The cleaning solution according to <1> or <2>, in which the mass ratio of the content of the compound (A) and the content of the anticorrosive agent (C) is from 1:5 to 150:1.

<8>

A method for cleaning a substrate, including: cleaning the substrate using the cleaning solution according to <1> or <2>, in which the substrate has a region in which a first metal atom-containing layer containing a cobalt atom and a second metal atom-containing layer containing a copper atom are in contact with each other, at least one of the first metal atom-containing layer and the second metal atom-containing layer being exposed on a surface of the substrate.

<9>

The method according to <8>, in which the substrate includes a wiring layer, and the wiring layer is the first metal atom-containing layer or the second metal atom-containing layer.

<10>

The method according to <8>, in which the substrate includes a wiring layer, the first metal atom-containing layer is a copper-containing wiring layer, and the second metal atom-containing layer is a barrier layer or a liner layer.

<11>

A method for manufacturing a semiconductor, including: preparing a substrate, in which the substrate has a region in which a first metal atom-containing layer containing a cobalt atom and a second metal atom-containing layer containing a copper atom are in contact with each other, at least one of the first metal atom-containing layer and the second metal atom-containing layer being exposed on a surface of the substrate; and cleaning the substrate using the cleaning solution according to <1> or <2>.

The present invention can provide a cleaning solution, a method for cleaning a substrate, and a method for manufacturing a semiconductor, which can achieve both anti-corrosion properties and residue removal properties at high levels.

DETAILED DESCRIPTION OF THE INVENTION

Figure 1A:
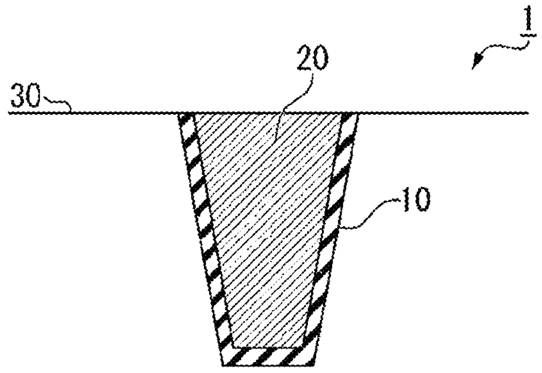
FIG. 1A illustrates an exemplary substrate to which a cleaning solution according to an embodiment of the present invention is applied.

Hereinafter, an embodiment for carrying out the present invention (hereinafter simply referred to as "the present embodiment") will be described in detail. The present embodiment below is an example for explaining the present invention, and it is not intended to limit the present invention to the following description. The present invention may be implemented with any appropriate modification within the scope of its gist.

In the drawings, the same elements are denoted by the same reference signs, and duplicate description will be omitted. In addition, the positional relationships such as top, bottom, left, and right are based on those illustrated in the drawings unless otherwise specified. Further, the dimensional ratios in the drawings are not limited to the illustrated ratios.

Cleaning Solution

A cleaning solution according to the present embodiment contains: at least one compound (A) selected from the group consisting of a compound a1 represented by a general formula (a1), a salt of the compound a1, a hydrate of the compound a1, hydrogen iodide, borane, and a complex of the borane; an amine compound that has 4 or more carbon atoms and is not the compound a1, or a salt thereof (B); and an anticorrosive agent (C), (a1)

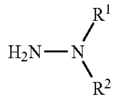

in which, $R^1$ and $R^2$ each independently represent an organic group that does not contain a carbonyl group, or a hydrogen atom.

The cleaning solution according to the present embodiment does not contain an alkylamine having 1 to 3 carbon atoms, a hydroxylamine, tris(2-hydroxyethyl)methylammonium hydroxide (THEMAH), cetyl trimethylammonium hydroxide (CTAH), or choline. Even if the cleaning solution according to the present embodiment does not contain such a component, it can at least achieve both anti-corrosion properties and residue removal properties at high levels. Here, the alkylamine having 1 to 3 carbon atoms is a primary amine compound having one alkyl group having 1 to 3 carbon atoms.

Component (A)

A component (A) is at least one compound selected from the group consisting of a compound a1 represented by a general formula (a1), a salt of the compound a1, a hydrate of the compound a1, hydrogen iodide, borane, and a complex of the borane, (a1)

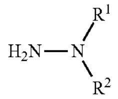

in which $R^1$ and $R^2$ each independently represent an organic group that does not contain a carbonyl group, or a hydrogen atom.

Examples of the compound a1 may include a hydrazine-based compound. However, since the organic group in $R^1$ and $R^2$ in the formula (a1) does not contain a carbonyl group, the compound (A) cannot be a hydrazide.

Examples of the organic group in $R^1$ and $R^2$ may include a hydrocarbon group which may have a substituent. The hydrocarbon group may be an aliphatic hydrocarbon group or an aromatic hydrocarbon group.

The aliphatic hydrocarbon group in $R^1$ and $R^2$ may be saturated or unsaturated. The aliphatic hydrocarbon group may be linear or branched, or may include a ring structure.

Examples of the linear aliphatic hydrocarbon group may include a linear alkyl group having 1 to 10 carbon atoms, preferably 1 to 8 carbon atoms, more preferably 1 to 6 carbon atoms, even more preferably 1 to 4 or 1 to 3 carbon atoms, and particularly preferably 1 or 2 carbon atoms. Specific examples thereof may include a methyl group, an ethyl group, an n-propyl group, an n-butyl group, an n-pentyl group, and the like.

Examples of the branched aliphatic hydrocarbon group may include a branched alkyl group having 3 to 10 carbon atoms, preferably 3 to 8 carbon atoms, more preferably 3 to 6 carbon atoms, and even more preferably 3 or 4 carbon atoms. Specific examples thereof may include an isopropyl group, an isobutyl group, a tert-butyl group, an isopentyl group, a neopentyl group, a 1,1-diethylpropyl group, a 2,2-dimethylbutyl group, and the like.

The aliphatic hydrocarbon group including a ring structure is an aliphatic hydrocarbon group containing an alicyclic group. The alicyclic group may be monocyclic or polycyclic.

Examples of the monocyclic aliphatic hydrocarbon group may include a group obtained by removing one hydrogen atom from a monocycloalkane. The monocycloalkane preferably has 3 to 6 carbon atoms. Specific examples of the monocycloalkane may include cyclopropane, cyclopentane, cyclohexane, and the like.

Examples of the polycyclic aliphatic hydrocarbon group may include a group obtained by removing one hydrogen atom from a polycycloalkane. The polycycloalkane preferably has 7 to 12 carbon atoms. Specific examples of the polycycloalkane may include adamantane, norbornane, isobornane, tricyclodecane, tetracyclododecane, and the like.

The aromatic hydrocarbon group in $R^1$ and $R^2$ is a hydrocarbon group having at least one aromatic ring. The aromatic ring is not particularly limited as long as it is a cyclic conjugated system having $(4n+2)$ $\pi$ electrons, and the aromatic ring may be monocyclic or polycyclic. The aromatic ring preferably has 5 to 30 carbon atoms, more preferably 5 to 20 carbon atoms, even more preferably 6 to 15 carbon atoms, and particularly preferably 6 to 12 carbon atoms.

Specific examples of the aromatic ring may include an aromatic hydrocarbon ring such as benzene, naphthalene, anthracene, phenanthrene, etc.; an aromatic heterocyclic ring in which a part of carbon atoms constituting the aromatic hydrocarbon ring is substituted with hetero atoms; and the like. Examples of the hetero atoms in the aromatic heterocyclic ring may include an oxygen atom, a sulfur atom, a nitrogen atom, and the like. Specific examples of the aromatic heterocyclic ring may include a pyridine ring, a thiophene ring, and the like.

Specific examples of the aromatic hydrocarbon group may include a group obtained by removing one hydrogen atom from the aromatic hydrocarbon ring or aromatic heterocyclic ring (an aryl group or heteroaryl group); a group obtained by removing one hydrogen atom from an aromatic compound containing 2 or more aromatic rings (such as biphenyl, fluorene, etc.); a group obtained by substituting one of the hydrogen atoms of the aromatic hydrocarbon ring or aromatic heterocyclic ring with an alkylene group (for example, an arylalkyl groups such as a benzyl group, phenethyl group, 1-naphthylmethyl group, 2-naphthylmethyl group, 1-naphthylethyl group, 2-naphthyl ethyl group, or the like); and the like. The alkylene group bonded to the aromatic hydrocarbon ring or aromatic heterocyclic ring preferably has 1 to 4 carbon atoms, more preferably 1 to 3 carbon atoms, and even more preferably 1 carbon atom.

The hydrocarbon group in $R^1$ and $R^2$ may have a substituent. The substituent is not particularly limited, and examples thereof may include a hydroxy group, an alkyl group, and a vinyl group. However, the substituent does not contain a carbonyl group.

$R^1$ and $R^2$ are preferably an aliphatic hydrocarbon group which may have a substituent, or a hydrogen atom; more preferably a linear or branched alkyl group which may have a substituent, or a hydrogen atom; and even more preferably a linear or branched hydroxyalkyl group, or a hydrogen atom. The linear hydroxyalkyl group or linear alkyl group preferably has 1 to 6 carbon atoms, more preferably 1 to 3 carbon atoms, and even more preferably 1 or 2 carbon atoms. The branched hydroxyalkyl group or branched alkyl group preferably has 3 to 6 carbon atoms, and more preferably 3 carbon atoms.

Preferable specific examples of the compound a1 may include hydrazine, 2-hydrazinoethanol, tert-butylhydrazine, 1,1-diethylhydrazine, 1,2-diethylhydrazine, methylhydrazine, ethylhydrazine, 1,1-dimethylhydrazine, 1,2-dimethylhydrazine, 1,2-diisopropylhydrazine, cyclohexylhydrazine, allyl hydrazine, isopropylhydrazine, tolylhydrazine, and the like. Among them, hydrazine, 2-hydrazinoethanol, tert-butylhydrazine, 1,2-dimethylhydrazine, and the like are more preferable.

The component (A) may be a hydrate of the compound a1. The hydration number of the hydrate of the compound a1 is not particularly limited. Examples of the hydrate of the compound a1 may include a monohydrate, a dihydrate, a trihydrate, and the like. Specific examples of the hydrate of the compound a1 may include hydrazine monohydrate.

The component (A) may be a salt of the compound a1. The salt of the compound a1 may be inorganic or organic. Examples of the salt may include, but are not limited to, hydrochloride, sulfate, carbonate, etc. Specific examples of the salt of the compound a1 may include tert-butylhydrazine hydrochloride, hydrazine sulfate, hydrazine carbonate, tolylhydrazine hydrochloride, and the like.

The hydrogen iodide of the component (A) may be used in the form of an aqueous solution such as hydroiodic acid, for example. When the hydrogen iodide is used in the form of an aqueous solution such as hydroiodic acid, etc., the content described below means the content of the component (hydrogen iodide, which is the active ingredient) excluding water as the solvent.

The borane of the component (A) may be a monomeric borane ($BH_3$), a dimeric diborane ($B_2H_6$), or the like. Specific examples of the complex of the borane (borane complex) may include, but are not limited to, bis(pinacolato) diboron, (dimethylphenylsilyl)(pinacolato)borane, tetrahydroxydiboron, borane-tert-butylamine complex, triphenylborane-pyridine complex, etc. Furthermore, examples of the complex may include, but are not limited to, a complex solution such as a borantetrahydrofuran (THF) complex ($BH_3OC_4H_8$), a borandimethyl sulfide complex ($(CH_3)_2S\cdot BH_3$), etc. Among them, bis(pinacolato)diboron, borandimethyl sulfide complex, and the like are preferable. When the complex is used in the form of a solution, the content described below means the content of the component (the active ingredient of borane or a borane complex) excluding the solvent.

Among the above, the compound (A) preferably contains at least one selected from the group consisting of a compound represented by the general formula (a1), in which $R^1$ and $R^2$ are each independently a hydrogen atom or an alkyl group, a salt thereof, and a hydrate thereof; a compound represented by the general formula (a1), in which $R^1$ is a hydrogen atom and $R^2$ is —$R^3$OH (in which $R^3$ represents an alkylene group having 2 or more carbon atoms), a salt thereof, and a hydrate thereof; hydrogen iodide; and bis(pinacolato)diboron.

In the above formula, $R^3$ preferably has 5 or less, more preferably 4 or less, and even more preferably 3 or less carbon atoms.

The component (A) may be used alone or in combination of two or more.

The content of the component (A) in the cleaning solution according to the present embodiment is not particularly limited, but it may for example be 10.0% by mass (100000 ppm) or less, preferably 5.0% by mass (50000 ppm) or less, more preferably 3.0% by mass (30000 ppm) or less, even more preferably 1.0% by mass (10000 ppm) or less, and still even more preferably 0.5% by mass (5000 ppm) or less, with respect to the total mass of the cleaning solution. From the viewpoint of cost, safety, etc., it is preferable to use the component (A) at a low concentration as long as an effect of the component (A) is exhibited. For example, the content of the component (A) in the cleaning solution according to the present embodiment may be 0.01% by mass (100 ppm) or less, or 0.009% by mass (90 ppm) or less.

The lower limit of the content of the component (A) is not particularly limited, but may for example be 0.0001% by mass (1 ppm) or more, preferably 0.0005% by mass (5 ppm) or more, more preferably 0.001% by mass (10 ppm) or more, even more preferably 0.002% by mass (20 ppm) or more, and still even more preferably 0.003% by mass (30 ppm) or more, with respect to the total mass of the cleaning solution.

When the content of the component (A) is equal to or higher than the lower limit described above, the corrosion potential difference with respect to a different kind of metal such as cobalt, etc. tends to be easily reduced when a substrate is cleaned with the cleaning solution according to the present embodiment.

The range of the content of the component (A) in the cleaning solution according to the present embodiment may for example be from 0.0001% by mass (1 ppm) to 10.0% by mass (100000 ppm), preferably from 0.0001% by mass (1 ppm) to 5.0% by mass (50000 ppm) or from 0.0005% by mass (5 ppm) to 3.0% by mass (30000 ppm), more preferably from 0.002% by mass (20 ppm) to 1.0% by mass (10000 ppm), and even more preferably from 0.003% by mass (30 ppm) to 0.5% by mass (5000 ppm), with respect to the total mass of the cleaning solution.

When the above-described salt, hydrate, complex, etc. are used as the component (A), the content of the component (A) means the content excluding these (that is, the content of the active ingredient). For example, when hydrazine monohydrate is used as the component (A), the above content is a numerical value calculated excluding the hydrate (that is, the content of hydrazine).

Component (B)

The component (B) has 4 or more carbon atoms and is an amine compound which is not the compound a1, or a salt thereof. The component (B) can increase the pH of the cleaning solution, so that high cleanability is expected to be obtained.

Examples of the component (B) may include ammonia, primary monoamine, secondary monoamine, tertiary monoamine, quaternary ammonium salt, secondary cyclic amine, tertiary cyclic amine, quaternary cyclic amine, primary alkanolamine, secondary alkanolamine, tertiary alkanolamine, diamine, polyamine, and the like. The amine as the component (B) may have 4 or more carbon atoms. The amine as the component (B) is preferably a water-soluble amine. The component (B) preferably exhibits basic properties in an aqueous solution. From the viewpoint of water solubility, etc., the component (B) is preferably an aliphatic amine, and more preferably an aliphatic amine having 4 or more carbon atoms.

Examples of the primary monoamine may include, but are not limited to, alkylamine such as n-butylamine, tert-butylamine, etc.; cycloalkylamine such as cyclopentylamine, cyclohexylamine, cyclohexanemethylamine, etc; and alkoxyamine such as methoxyethylamine, methoxypropylamine, methoxybutylamine, ethoxypropylamine, propoxypropylamine, etc.; and the like.

Examples of the secondary monoamine may include, but are not limited to, alkylamine such as diethylamine, dipropylamine, diisopropylamine, dibutylamine, diisobutylamine, butylmethylamine, etc.; cycloalkylamine such as N,N-dicyclohexylamine, N-cyclopentylcyclohexaneamine, etc.; alkoxyamine such as N-(2-methoxyethyl)ethylamine, etc.; and the like.

Examples of the tertiary monoamine may include, but are not limited to, alkylamine such as triethylamine, tripropylamine, tributylamine, triisobutylamine, dimethylethylamine, dimethylpropylamine, allyldiethylamine, dimethyl-n-butylamine, diethylisopropylamine, etc.; and cycloalkylamine such as tricyclopentylamine, tricyclohexylamine, etc.; and the like.

Examples of the quaternary amine may include a salt of quaternary ammonium (quaternary ammonium salt). Examples of the quaternary ammonium salt may include fluoride, chloride, bromide, iodide, sulfate, hydrogen sulfate, acetate and the like of quaternary ammonium. Specific examples of the quaternary ammonium salt may include, but are not limited to, tetraethylammonium chloride, tetramethylammonium chloride, tetrapropylammonium chloride, tetrabutylammonium chloride, tetraethylammonium bromide, tetramethylammonium bromide, tetrapropylammonium bromide, tetrabutylammonium bromide, tetraethylammonium fluoride, tetramethylammonium fluoride, tetrapropylammonium fluoride, tetrabutylammonium fluoride, tetraethylammonium iodide, tetramethylammonium iodide, tetrapropylammonium iodide, tetrabutylammonium iodide, tetraethylammonium hydrogen sulfate, tetramethylammonium hydrogen sulfate, tetrapropylammonium hydrogen sulfate, tetrabutylammonium hydrogen sulfate, tetramethylammonium acetate, etc. The ammonium salt is preferably not a hydroxide.

Examples of the secondary cyclic amine may include piperidines (a compound having a piperidine skeleton), pyrrolidines (a compound having a pyrrolidine skeleton), morpholines (a compound having a morpholine skeleton), and the like. Examples of the piperidines that are the secondary cyclic amine may include piperidine, 2-pipecoline, 3-pipecoline, 4-pipecoline, 2,6-dimethylpiperidine, 3,5-dimethylpiperidine, and the like. Examples of the pyrrolidines may include pyrrolidine, 2-methylpyrrolidine, 3-methylpyrrolidine, and the like. Examples of the morpholines may include morpholine, 2-methylmorpholine, 3-methylmorpholine, and the like.

Examples of the tertiary cyclic amine may include piperidines, pyrrolidines, morpholines, and the like. Examples of the piperidines may include N-methylpiperidine and the like. Examples of the pyrrolidines may include N-methylpyrrolidine and the like. Examples of the morpholines may include N-methylmorpholine and the like.

Examples of the quaternary cyclic amine may include fluoride, chloride, bromide, iodide, sulfate, hydrogen sulfate, acetate, and the like of piperidines, pyrrolidines, morpholines, and the like.

Examples of the primary alkanolamine may include, but are not limited to, 4-amino-1-butanolamine, 2-amino-2-methyl-1-propanol, 2-(2-aminoethoxy)ethanol, and the like.

Examples of the secondary alkanolamine may include, but are not limited to, N-ethylethanolamine, N-methylpropanolamine, diethanolamine, diisopropanolamine, 2-[(hydroxymethyl)amino]ethanol, 4-methylaminobutanol, 2-(2-aminoethylamino)ethanol (AEEA), 3-piperidinemethanol, 4-piperidinemethanol, 2-piperidineethanol, 4-piperidineethanol, and the like.

Examples of the tertiary alkanolamine may include, but are not limited to, N,N-dimethylethanolamine, N,N-dimethylpropanolamine, N,N-diethylethanolamine, N-ethyldiethanolamine, N-methyldiethanolamine, triethanolamine, triisopropanolamine, and the like.

The diamine may be any of a primary diamine, a secondary diamine, and a tertiary diamine. Examples of the primary diamine may include, but are not limited to, 1,4-butanediamine, 1,6-hexanediamine, pentane-1,5-diamine, and the like. Examples of the secondary diamine may include, but are not limited to, 2-methylpiperazine, 2,3-dimethylpiperazine, 2,5-dimethylpiperazine, N,N'-dimethylethanediamine, N,N'-dimethylpropanediamine, N,N'-diethylethylenediamine, N,N'-diethylpropanediamine, N,N'-diisopropylethylenediamine, and the like. Examples of the tertiary diamine may include, but are not limited to, 4-dimethylaminopyridine, N,N,N',N'-tetramethylethylenediamine, N,N,N',N'-tetraethylethylenediamine, N,N,N',N'-tetramethyl-1,3-diaminopropane, N,N,N',N'-tetramethyl-1,3-diaminobutane, N,N,N',N'-tetramethyl-1,4-diaminobutane, N,N,N',N'-tetramethylphenylenediamine, 1,2-dipiperidinoethane, and the like.

Polyamine is a compound containing 3 or more amino groups. The polyamine may contain any of a primary amino group, a secondary amino group, and a tertiary amino group. Examples of the polyamine may include diethylenetriamine, spermine, spermidine, 3,3'-iminobis(propylamine), N,N-bis(3-aminopropyl)methylamine, N,N-bis(3-aminopropyl)butylamine, N-(3-aminopropyl)-N-dodecylpropane-1,3-diamine, N,N,N',N'',N''-pentamethyldiethylenetriamine, N,N,N',N'',N''-pentamethyldipropylenetriamine, tris[2-(dimethylamino)ethyl]amine, 2-aminomethylpyrimidine, 1,4-bis(3-aminopropyl)piperazine, 1-amino-4-cyclopentylpiperazine, 1-(2-pyridyl)piperazine, and the like.

The component (B) may be any of a quaternary amine, a tertiary amine, a secondary amine, and a primary amine, but the component (B) is preferably a tertiary amine or a secondary amine, and more preferably a tertiary amine. The component (B) is preferably a monoamine, more preferably a tertiary monoamine or a tertiary alkanolamine, and even more preferably a tertiary aliphatic monoamine or a tertiary alkanolamine. From the viewpoint of adjusting the amount of oxide film to be removed, the component (B) is preferably a tertiary aliphatic monoamine, and from the viewpoint of cleanliness after the removal, the component (B) is more preferably a tertiary alkanolamine.

A preferred example of the component (B) preferably contains at least one selected from the group consisting of:

$$H_2N—R^4—NH—R^5—OH$$

($R^4$ and $R^5$ each independently represent an alkylene group having 2 or more carbon atoms);

$$H_2N—R^6—NH—R^7—NH_2$$

($R^6$ and $R^7$ each independently represent an alkylene group having 2 or more carbon atoms);

$$HO—R^8—N(—R^9—OH)—R^{10}—OH$$

($R^8$, $R^9$ and $R^{10}$ each independently represent an alkylene group having 2 or more carbon atoms);

a tertiary amine; and a quaternary amine.

In the above formula, $R^4$ and $R^5$ each independently preferably have 8 or less carbon atoms, and more preferably 6 or less carbon atoms. $R^6$ and $R^7$ each independently preferably have 8 or less carbon atoms, and more preferably 6 or less carbon atoms. $R^1$, $R^9$ and $R^{10}$ each independently preferably have 8 or less carbon atoms, and more preferably 6 or less carbon atoms.

The component (B) may be used alone or in combination of two or more.

The content of the component (B) in the cleaning solution according to the present embodiment is not particularly limited, but it is preferably 10% by mass or less, more preferably 8% by mass or less, even more preferably 5% by mass, and still even more preferably 4% by mass or less, 3% by mass or less, or 2% by mass or less, with respect to the total mass of the cleaning solution. The lower limit of the content of the component (B) is not particularly limited, but it may for example be 0.001% by mass or more, preferably 0.005% by mass or more, more preferably 0.01% by mass or more, even more preferably 0.02% by mass or more, and still even more preferably 0.03% by mass or more, or 0.05% by mass or more, with respect to the total mass of the cleaning solution.

When the content of the component (B) is equal to or higher than the preferred lower limit described above, a high pH of the cleaning solution is easily maintained. When the content of the component (B) is equal to or lower than the preferred upper limit described above, it tends to be easier to balance the component (B) with another component.

The range of the content of the component (B) in the cleaning solution according to the present embodiment may for example be from 0.001 to 10% by mass, preferably from 0.002 to 5% by mass, more preferably from 0.01 to 3% by mass, and even more preferably from 0.02 to 2.0% by mass, or from 0.03 to 1.5% by mass, with respect to the total mass of the cleaning solution.

When the above-described salt, hydrate, complex, etc. are used as the component (B), the content of the component (B) means the content excluding these (that is, the content of the active ingredient).

The mass ratio of the content of the compound (A) and the content of the amine compound or a salt thereof (B) is preferably from 20:1 to 1:30. The mass ratio, (A):(B), is more preferably from 10:1 to 1:25, even more preferably from 5:1 to 1:20, still even more preferably from 3:1 to 1:15, and further more preferably from 5:4 to 1:10.

Component (C)

The component (C) is an anticorrosive agent. The anticorrosive agent preferably contains at least one selected from the group consisting of an imidazole ring-containing compound, a triazole ring-containing compound, a pyridine ring-containing compound, a pyrimidine ring-containing compound, a tetrazole ring-containing compound, a pyrazole ring-containing compound, a purine ring-containing compound, a phenanthroline ring-containing compound, a thiol-containing compound, a phosphonic acid-containing compound, and a phosphinic acid-containing compound.

Examples of the imidazole ring-containing compound may include imidazoles such as 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole, 2-aminoimidazole, benzimidazole, etc.; biimidazoles such as 2,2'-biimidazole, etc.; and the like. Among them, biimidazoles are preferable, and 2,2'-biimidazole is more preferable.

Examples of the triazole ring-containing compound may include triazoles such as 1,2,3-triazole, 1,2,4-triazole, 3-amino-1H-1,2,4-triazole, 1-acetyl-1H-1,2,3-triazolo[4,5-b]pyridine, 1H-1,2,3-triazolo[4,5-b]pyridine, 1,2,4-triazolo[4,3-a]pyridin-3(2H)-one, 3H-1,2,3-triazolo[4,5-b]pyridin-3-ol, etc.; benzotriazoles such as 1,2,3-benzotriazole, 5-methyl-1H-benzotriazole, 1-hydroxybenzotriazole, 1-dihydroxypropylbenzotriazole, 2,3-dicarboxypropylbenzotriazole, 4-hydroxybenzotriazole, 4-carboxyl-1H-benzotriazole, 4-carboxyl-1H-benzotriazole methyl ester, 4-carboxyl-1H-benzotriazolebutyl ester, 4-carboxyl-1H-benzotriazole octyl ester, 5-hexylbenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl] phosphonic acid, and 3-aminotriazole, etc.; and the like.

Examples of the pyridine ring-containing compound may include pyridines such as 1H-1,2,3-triazolo[4,5-b]pyridine, 1-acetyl-1H-1,2,3-triazolo[4,5-b]pyridine, 3-aminopyridine, 4-aminopyridine, 3-hydroxypyridine, 4-hydroxypyridine, 2-acetamidopyridine, 4-pyrrolidinopyridine, 2-cyanopyridine, 2,6-pyridinecarboxylic acid, 2,4,6-trimethylpyridine, etc.; bipyridyls such as 2,2'-bipyridyl, 4,4'-dimethyl-2,2'-bipyridyl, 4,4'-di-tert-butyl-2,2'-bipyridyl, 4,4'-dinonyl-2,2'-bipyridyl, 2,2"-bipyridine-6,6'-dicarboxylic acid, 4,4'-dimethoxy-2,2'-bipyridyl, etc.; and the like. Among them, bipyridyls are preferable, and 2,2'-bipyridyl, 4,4'-dimethyl-2,2'-bipyridyl, 4,4'-di-tert-butyl-2,2'-bipyridyl, 4,4'-dinonyl-2,2'-bipyridyl, 2,2'-bipyridine-6,6'-dicarboxylic acid, and 4,4'-dimethoxy-2,2'-bipyridyl are more preferable.

Examples of the pyrimidine ring-containing compound may include pyrimidine, 4-methylpyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxypyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro-(1,2,4)triazolo(1,5-a)pyrimidine, 4-aminopyrazolo[3,4-d]pyrimidine, and the like.

Examples of the tetrazole ring-containing compound may include 1H-tetrazole, 5-amino-1H-tetrazole, 5-methyl-1H-tetrazole, 5-phenyl-1H-tetrazole, 1-(2-diaminoethyl)-5-mercaptotetrazole, and the like.

Examples of the pyrazole ring-containing compound may include 3,5-dimethylpyrazole, 3-amino-5-methylpyrazole, 4-methylpyrazole, 3-amino-5-hydroxypyrazole, and the like.

Examples of the purine ring-containing compound may include adenine, guanine, hypoxanthine, xanthine, uric acid, theophylline, and the like.

Examples of the phenanthroline ring-containing compound may include 1,10-phenanthroline and the like.

Examples of the thiol-containing compound may include thioglycerol, propanethiol, butanethiol, hexanethiol, octanethiol, octadecanethiol, cyclohexanethiol, cyclopentanethiol, p-toluenthiol, benzentiol, 2-naphthalenethiol, pentafluorobenzenethiol, 3,5-dimethylbenzenethiol, 4-methylbenzyl mercaptan, 2-phenylethanethiol, 2,4,5-trichlorobenzenethiol, 4-aminobenzenethiol, 2,3-butanedithiol, 1,6-hexanedithiol, 4-(dimethylamino)benzenethiol, 3-mercaptopropionic acid, isobutyl mercaptan, 5-amino-1,3,4-thiadiazole-2-thiol, and the like.

Examples of the phosphonic acid-containing compound may include octyl phosphonic acid, tetradecyl phosphonic acid, decyl phosphonic acid, dodecylphosphonic acid, octadecyl phosphonic acid, 1,8-octanediphosphonic acid, vinylphosphonic acid, phenylphosphonic acid, diphenylphosphonic acid, aminomethylphosphonic acid, aminoethylphosphonic acid, (4-bromobutyl)phosphonic acid, (4-aminobenzyl)phosphonic acid, (4-aminophenyl)phosphonic acid, aminotri(methylenephosphonic acid), ethylenediaminetetramethylenephosphonic acid, bis(hexamethylene) triamine phosphonic acid, 2-amino-2-propylphosphonic acid, nitrilotrismethylene phosphonic acid, benzhydrylphosphonic acid, 1-hydroxyethane-1,1-diphosphonic acid, bis(2,2,2-trifluoroethyl) phosphonate, and the like.

Examples of the phosphinic acid-containing compound may include octylphosphinic acid, tetradecylphosphinic acid, decylphosphinic acid, dodecylphosphinic acid, octadecylphosphinic acid, 1,8-octanediphosphinic acid, dimethylphosphinic acid, vinylphosphinic acid, aminomethylphosphinic acid, aminoethylphosphinic acid, phenylphosphinic acid, diphenylphosphinic acid, phenylvinylphosphinic acid, bis(4-methoxyphenyl)phosphinic acid, and the like.

The anticorrosive agent may be used alone or in combination of two or more.

When the cleaning solution according to the present embodiment contains an anticorrosive agent, the content of the anticorrosive agent is not particularly limited. The content thereof is preferably from 0.0001 to 0.3% by mass (from 1 to 3000 ppm), more preferably from 0.0002 to 0.2% by mass (from 2 to 2000 ppm), and even more preferably from 0.0005 to 0.1% by mass (from 5 to 1000 ppm), with respect to the total mass of the cleaning solution.

The mass ratio of the content of the compound (A) and the content of the anticorrosive agent (C) is preferably from 1:5 to 150:1. The mass ratio, (A):(C), is more preferably from 1:3 to 100:1, even more preferably from 1:1 to 50:1, still even more preferably from 2:1 to 25:1, and further more preferably from 3:1 to 20:1.

Optional Component

The cleaning solution according to the present embodiment may contain an optional component other than the above components within a range in which a mechanism or effect of the present embodiment can be obtained. Exemplary optional components are described below.

(Buffer)

The cleaning solution according to the present embodiment may contain a buffer. A buffer is a compound that has a mechanism of inhibiting a change in the pH of a solution.

The buffer is not particularly limited as long as it is a compound having pH buffering ability. For example, the buffer may be a compound having a pKa of 6 to 11.

Examples of the buffer may include Good's buffer. Examples of Good's buffer may include 2-cyclohexylaminoethanesulfonic acid (CHES), 3-cyclohexylaminopropanesulfonic acid (CAPS), N-tris(hydroxymethyl)methyl-3-aminopropanesulfonic acid (TAPS), 4-(cyclohexylamino)-1-butanesulfonic acid (CABS), tricine, bicine, 2-morpholinoethanesulfonic acid monohydrate (MES), bis(2-hydroxyethyl)aminotris(hydroxymethyl)methane (Bis-Tris), N-(2-acetamido)iminodiacetic acid (ADA), piperazine-1,4-bis(2-ethanesulfonic acid) (PIPES), N-(2-acetamido)-2-aminoethanesulfonic acid (ACES), 2-hydroxy-3-morpholinopropanesulfonic acid (MOPSO), N,N-bis(2-hydroxyethyl)-2-aminoethanesulfonic acid (BES), 3-morpholinopropanesulfonic acid (MOPS), N-tris(hydroxymethyl)methyl-2-aminoethanesulfonic acid (TES), 2-[4-(2-hydroxyethyl)-1-piperazinyl]ethanesulfonic acid (HEPES), 3-[N-tris(hydroxymethyl)methylamino]-2-hydroxypropanesulfonic acid (TAPSO), piperazine-1,4-bis(2-hydroxypropanesulfonic acid) (POPSO), 4-(2-hydroxyethyl)piperazine-1-(2-hydroxypropane-3-sulfonic acid) (HEPSO), 4-(2-hydroxyethyl)-1-piperazinepropanesulfonic acid (EPPS), and the like.

The buffer may be used alone or in combination of two or more.

When the cleaning solution according to the present embodiment contains a buffer, the content of the buffer is not particularly limited. The content thereof may for example be from 0.001 to 10% by mass, preferably from 0.005 to 5% by mass, more preferably from 0.01 to 1% by mass, and even more preferably from 0.05 to 0.5% by mass or from 0.05 to 0.3% by mass, with respect to the total mass of the cleaning solution.

The cleaning solution according to the present embodiment may not contain a buffer and may not contain one or more of the above compounds exemplified as the buffer.

(Organic Solvent)

The cleaning solution according to the present embodiment may contain an organic solvent. The organic solvent is preferably a water-soluble organic solvent. Examples of the water-soluble organic solvent may include alcohols (such as isopropanol, ethanol, ethylene glycol, propylene glycol, glycerin, 1,3-propanediol, 1,3-butanediol, 1,4-butanediol, diethylene glycol, dipropylene glycol, furfuryl alcohol, 2-methyl-2,4-pentanediol, etc.), dimethyl sulfoxide, ethers (such as ethylene glycol dimethyl ether, diethylene glycol dimethyl ether, triethylene glycol dimethyl ether, tetraethylene glycol dimethyl ether, and propylene glycol dimethyl ether), and the like.

The water-soluble organic solvent may be used alone or in combination of two or more.

When the cleaning solution according to the present embodiment contains a water-soluble organic solvent, the content of the water-soluble organic solvent is preferably 50% by mass or less, more preferably 30% by mass or less, and even more preferably 20% by mass or less, with respect to the total content of water and the water-soluble organic solvent.

The cleaning solution according to the present embodiment may not contain an organic solvent or a water-soluble organic solvent and may not contain one or more of the above compounds exemplified as the water-soluble organic solvent.

(Surfactant)

The cleaning solution according to the present embodiment may contain a surfactant for the purpose of adjusting wettability of the cleaning solution to a substrate; and the like. The surfactant may be a nonionic surfactant, an anionic surfactant, a cationic surfactant, or an amphoteric surfactant.

Examples of the nonionic surfactant may include a polyalkylene oxide alkyl phenyl ether-based surfactant, a polyalkylene oxide alkyl ether-based surfactant, a block polymer-based surfactant composed of polyethylene oxide and polypropylene oxide, a polyoxyalkylene distyrenated phenyl ether-based surfactant, a polyalkylene tribenzyl phenyl ether-based surfactant, an acetylene polyalkylene oxide-based surfactant, and the like.

Examples of the anionic surfactant may include alkyl sulfonic acid, alkyl benzene sulfonic acid, alkyl naphthalene sulfonic acid, alkyl diphenyl ether sulfonic acid, fatty acid amide sulfonic acid, polyoxyethylene alkyl ether carboxylic acid, polyoxyethylene alkyl ether acetic acid, polyoxyethylene alkyl ether propionic acid, alkyl phosphonic acid, fatty acid, a salt thereof, and the like. Examples of the "salt" may include an ammonium salt, a sodium salt, a potassium salt, a tetramethylammonium salt, and the like.

Examples of the cationic surfactant may include an alkylpyridium-based surfactant and the like.

Examples of the amphoteric surfactant may include a betaine-type surfactant, an amino acid-type surfactant, an imidazoline-type surfactant, an amine oxide-type surfactant, and the like.

These surfactants are generally commercially available. These surfactants may be used alone or in combination of two or more.

When the cleaning solution according to the present embodiment contains a surfactant, the content of the surfactant is not particularly limited. The content thereof is preferably from 0.0001 to 5% by mass, more preferably from 0.001 to 3% by mass, even more preferably from 0.002 to 1% by mass, and still even more preferably from 0.002 to 0.2% by mass, with respect to the total mass of the cleaning solution. When the content of the surfactant is within the above preferred range, bubbles generated by a foaming agent tend to be dense.

The cleaning solution according to the present embodiment may not contain one or more kinds of surfactant selected from the group consisting of the nonionic surfactant, the anionic surfactant, the cationic surfactant, and the amphoteric surfactant, and may not contain one or more of the above compounds exemplified as these surfactants. The cleaning solution according to the present embodiment may not contain a surfactant.

(Impurity)

The cleaning solution according to the present embodiment may contain, for example, a metal impurity including a metal atom such as a Fe, Cr, Ni, Zn, Ca, or Pb atom. The total content of such metal atoms in the cleaning solution according to the present embodiment is preferably 100 mass ppt or less with respect to the total mass of the cleaning solution. The lower the lower limit of the total content of the metal atoms, the more preferable it is. For example, the lower limit may be 0.001 mass ppt or more. Examples of the total content of the metal atoms may include from 0.001 mass ppt to 100 mass ppt. The total content of the metal atoms equal to or lower than the above preferred upper limit improves defect suppression properties and residue suppression properties of the cleaning solution. It is considered that, with the total content of the metal atoms equal to or higher than the above preferred lower limit, the metal atoms are less likely to be a free atom in the system and less likely to have a negative impact on the production yield of an entire object to be cleaned (However, the mechanism and effect according to the present embodiment are not limited thereto.).

The content of the metal impurity can be adjusted by, for example, a purification process such as filtering, etc. The purification process such as filtering, etc. may be performed on a part or all of the raw materials before preparation of the cleaning solution or may be performed after preparation of the cleaning solution.

The cleaning solution according to the present embodiment may contain, for example, an impurity derived from an organic substance (organic impurity). The total content of the organic impurity in the cleaning solution according to the present embodiment is preferably 5000 ppm by mass or less. The lower the lower limit of the total content of the organic impurity, the more preferable it is. For example, the lower limit may be 0.1 ppm by mass or more. Examples of the total content of the organic impurity may include from 0.1 mass ppm to 5000 mass ppm.

The cleaning solution according to the present embodiment may contain an object to be counted of such a size as counted by a light scattering liquid-borne particle counter, for example. The size of the object to be counted is, for example, 0.04 m or more. The number of the object to be counted contained in the cleaning solution according to the present embodiment is, for example, 1,000 or less per 1 mL of the cleaning solution, and the lower limit thereof is, for example, 1 or more. It is considered that the number of the object to be counted in the cleaning solution within the above numerical range improves a metal corrosion suppression effect of the cleaning solution (However, the mechanism and effect according to the present embodiment are not limited thereto.).

The organic impurity and/or the object to be counted may be added to the cleaning solution or may be inevitably mixed in the cleaning solution in the manufacturing process of the cleaning solution. As non-limiting examples of the case that the organic impurity and/or the object to be counted is inevitably mixed in the cleaning solution in the manufacturing process of the cleaning solution, the organic impurity may be contained in a raw material (for example, an organic solvent) used for manufacturing the cleaning solution, or may be mixed in from an external environment in the manufacturing process of the cleaning solution (for example, contamination).

In the case that the object to be counted is added to the cleaning solution, the presence ratio may be adjusted for each specific size in consideration of surface roughness of an object to be cleaned, and the like.

pH

The pH of the cleaning solution according to the present embodiment is preferably 7.0 or more and 13.0 or less. The lower limit of the pH of the cleaning solution is preferably pH 8.0 or more, and more preferably pH 9.0 or more. The upper limit of the pH of the cleaning solution is preferably pH 14.0 or less, more preferably pH 13.0 or less, and even more preferably pH 12.5 or less. Among them, the pH range of the cleaning solution is preferably from pH 7.0 to pH 12.5, and more preferably from pH 8.0 to 12.0. The pH value here is a value measured by a pH meter under conditions of room temperature (23° C.) and normal pressure (1 atm).

Storage Container

A storage method of the cleaning solution according to the present embodiment is not particularly limited, and any conventionally known storage container can be used. In order to ensure the stability of the cleaning solution, the void ratio in a container in which the cleaning solution is stored and/or the kind of gas that fills the void may be appropriately set. For example, the void ratio in the storage container may be about 0.01 to 30% by volume.

The cleaning solution according to the present embodiment may be diluted 2 to 2000 times to obtain a diluted solution at the time of use, and a cleaning step may then be performed using the diluted solution.

Regarding components other than the above-described components (A) to (C), the cleaning solution according to the present embodiment may not contain one or more components selected from the group consisting of a hydrazide compound, an ethylene oxide-containing compound, a propylene oxide-containing compound, an alkylene oxide-containing compound, a fluorine compound, sugars, sugar alcohols, catechols, an inorganic alkaline compound, alcohol, glycerin, a glycerin derivative, ascorbic acid, carbohydrazide, hydroquinone, hydroquinone monomethyl ether, hydroxyamine, diethylhydroxyamine, dimethylglyoxime, methyl ethyl ketooxime, ammonium sulfite, carboxylic acids, polyphosphonic acids, arylphosphonic acids; an ammonium salt and an alkali metal salt of these compounds; a saturated aliphatic monohydric alcohol, alkoxy alcohol, glycol, glycol ether, ketone, nitrile, aminopolycarboxylic acid, hydroxycarboxylic acid, purine, azole, pyrimidine, thiazole, thiazolinone, polyphenol, a barbiturate derivative, an abrasive, and Schiff base.

Substrate, Etc.

A preferred example of a substrate to which the cleaning solution according to the present embodiment is applied will be described. The cleaning solution according to the present embodiment can be used for cleaning a wide range of substrates such as a substrate used in a manufacturing process of a semiconductor, a substrate to be a product, etc. Among them, the cleaning solution according to the present embodiment is expected to provide a particularly excellent effect in cleaning a substrate in which a first metal atom-containing layer containing a cobalt atom and a second metal atom-containing layer containing a metal atom that is not a cobalt atom (hereinafter, also referred to as "non-cobalt metal", etc.) are in contact with each other. Among such substrates, the cleaning solution according to the present embodiment is expected to provide a particularly excellent effect in cleaning a substrate in which at least one of the first metal atom-containing layer and the second metal atom-containing layer is exposed on a surface of the substrate.

The first metal atom-containing layer contains a cobalt atom. The cobalt atom contained in the first metal atom-containing layer may be elemental cobalt, a cobalt alloy, or a cobalt compound. Examples of the cobalt compound may include cobalt oxide, cobalt nitride, cobalt oxynitride, and the like. The content of the cobalt in the first metal atom-containing layer is preferably 20% by mass or more, more preferably 30% by mass or more, and even more preferably 40% by mass or more, and may be 100 by mass, with respect to the total mass of the composition forming the first metal atom-containing layer. The first metal atom-containing layer can be formed by a known method such as CVD, ALD, PVD, or the like.

The second metal atom-containing layer contains a non-cobalt metal. The non-cobalt metal contained in the second metal atom-containing layer may be elemental non-cobalt metal, a non-cobalt metal alloy, or a non-cobalt metal compound. Examples of the non-cobalt metal compound may include an oxide, nitride, and oxynitride of the non-cobalt metal, etc. Examples of the metal atom contained in the second metal atom-containing layer may include a metal atom of a noble metal. Examples of the noble metal may include a metal nobler than cobalt. In addition to the second metal atom-containing layer containing the non-cobalt metal, the substrate may further include a third metal atom-containing layer containing a non-cobalt metal that is not the non-cobalt metal contained in the second metal atom-containing layer. Furthermore, the substrate may include a fourth metal atom-containing layer, a fifth metal atom-containing layer, and so on.

As used herein, examples of the noble metal may include copper, silver, titanium, ruthenium, rhodium, palladium, osmium, iridium, mercury, gold, platinum, graphite, and the like. Examples of the non-cobalt metal contained in the second metal atom-containing layer may include elemental noble metal, an alloy of the noble metal, an oxide, nitride and oxynitride of the noble metal, and the like.

Specific examples of a material for forming the second metal atom-containing layer may include copper, tungsten, molybdenum, titanium nitride (TiN), tantalum nitride (TaN), and the like. The second metal atom-containing layer can be formed by a known method such as plating, CVD, ALD, PVD, or the like.

Among the above, the second metal atom is preferably a copper atom. That is, a preferred example of the cleaning solution according to the present embodiment is a cleaning solution for cleaning a substrate that has a region in which the first metal atom-containing layer containing a cobalt atom and the second metal atom-containing layer containing a copper atom are in contact with each other, at least one of the first metal atom-containing layer and the second metal atom-containing layer being exposed on a surface of the substrate.

In the above substrate, at least one of the first metal atom-containing layer and the second metal atom-containing layer is exposed on a surface of the substrate. Only one of the first metal atom-containing layer and the second metal atom-containing layer may be exposed, or both may be exposed.

In the substrate, the first metal atom-containing layer and the second metal atom-containing layer are present in contact with each other. The first and second metal atom-containing layers may be in contact with each other at least in part. The first and second metal atom-containing layers are preferably in contact with each other at a portion where at least one of the metal atom-containing layers is exposed. The first and second metal atom-containing layers are preferably present adjacent to each other.

Figure 1B:
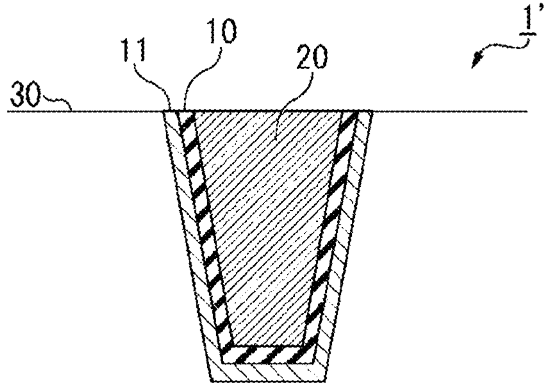
FIG. 1B illustrates an exemplary substrate to which a cleaning solution according to an embodiment of the present invention is applied.

FIGS. 1A and 1B illustrate an exemplary substrate to which the cleaning solution according to the present embodiment is applied.

FIG. 1A illustrates a substrate 1 after CMP of a wiring layer, for example. In the substrate 1, a wiring layer 20 is formed in a Low-k layer 30. Below the wiring layer 20, a liner layer 10 is formed adjacent to the wiring layer 20. As illustrated in FIG. 1B, a barrier layer 11 may be formed below the liner layer 10 so as to be adjacent to the liner layer 10.

In the substrate 1, the first metal atom-containing layer may be the liner layer 10 or the wiring layer 20. When the first metal atom-containing layer is the liner layer 10, the second metal atom-containing layer may be the barrier layer 11 or the wiring layer 20. Alternatively, the second metal-containing layer may be both the barrier layer 11 and the wiring layer 20. Furthermore, the barrier layer 11 and the wiring layer 20 may contain different metal species. When the first metal atom-containing layer is the wiring layer 20, the second metal atom-containing layer may be the liner layer 10 or the barrier layer 11. Alternatively, the second metal-containing layer may be both the liner layer 10 and the barrier layer 11. Furthermore, the liner layer 10 and the barrier layer 11 may contain different metal species.

For example, in the substrate 1, when the first metal atom-containing layer is the liner layer 10, the second metal atom-containing layer preferably contains copper. For example, the first metal atom-containing layer is a cobalt-containing liner layer 10, and the second metal atom-containing layer is a copper-containing wiring layer 20. When the barrier layer 11 is provided, the barrier layer 11 may contain TiN or TaN. The first metal-containing layer may be the barrier layer 11. In this case, the liner layer 10 may be omitted. For example, the first metal-containing layer may be a cobalt-containing barrier layer.

When the first metal atom-containing layer is the wiring layer 20, the second metal atom-containing layer preferably contains TiN or TaN. For example, the first metal atom-containing layer is the wiring layer 20 formed of cobalt, and the second metal atom-containing layer is the liner layer 10 formed of TiN or TaN.

The above is merely an example of a possible configuration of the substrate 1, and it goes without saying that the first and second metal species and the structure of each layer may be modified as appropriate depending on desired purpose.

In the substrate 1, the first metal atom-containing layer containing cobalt and the second metal atom-containing layer containing a non-cobalt metal are adjacent to each other and exposed on a surface of the substrate 1. When the substrate 1 is cleaned with a cleaning solution, corrosion potentials occur on the metals due to contact between the cleaning solution and the metals. In the case of a conventional cleaning solution, the cobalt contained in the first metal atom-containing layer has a high corrosion potential, and the difference in corrosion potential between the cobalt and the non-cobalt metal contained in the second metal atom-containing layer increases. It is considered that galvanic corrosion thereby occurs at the interface between the first metal atom-containing layer and the second metal atom-containing layer.

Galvanic corrosion is a phenomenon in which when different metals come into contact to each other to conduct electrons in a corrosive environment such as an electrolyte, corrosion of one of the metals is accelerated. Galvanic corrosion occurs when a corrosion cell is formed between two kinds of metals and the environment.

On the other hand, in the cleaning solution according to the present embodiment, the corrosion potential of cobalt does not become too high, and the difference in corrosion potential with respect to the non-cobalt metal is reduced. Therefore, even if a substrate in which the first metal atom-containing layer and the second metal atom-containing layer are adjacent to each other, such as the substrate 1, is cleaned, the occurrence of galvanic corrosion is suppressed (However, the mechanism and effect according to the present embodiment are not limited thereto.).

Figure 2A:
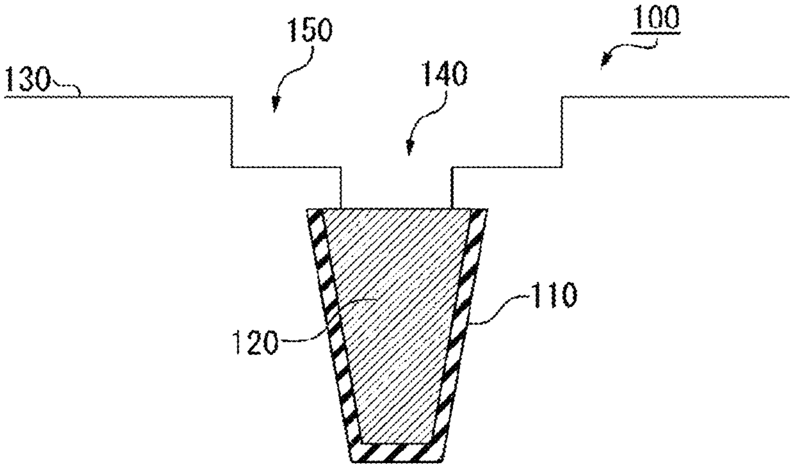
FIG. 2A illustrates another exemplary substrate to which a cleaning solution according to an embodiment of the present invention is applied.
Figure 2B:
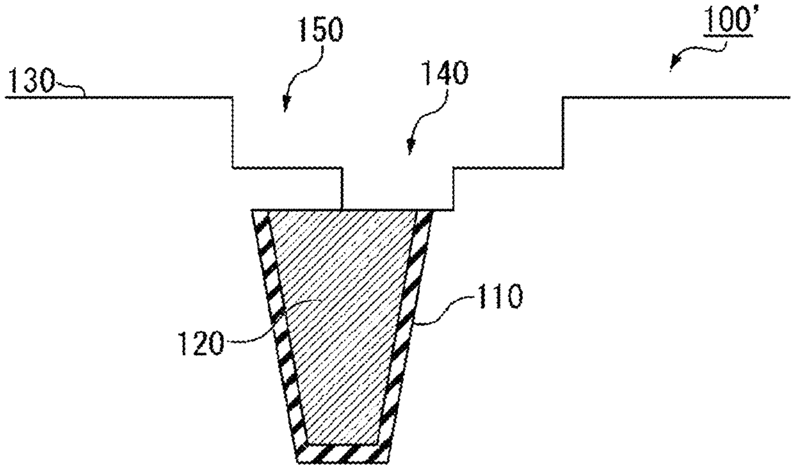
FIG. 2B illustrates another exemplary substrate to which a cleaning solution according to an embodiment of the present invention is applied.

FIGS. 2A and 2B illustrate another exemplary substrate to which the cleaning solution according to the present embodiment is applied.

FIG. 2 illustrates a substrate 100 in which a via 140 and a trench 150 have been formed so as to connect to a wiring layer 120, for example, by a dual damascene process. The substrate 100 may also include an etch stop layer provided below the Low-k layer 130 forming the via 140 (on the wiring layer 120 and the liner layer 110 that is adjacent to the wiring layer 120)(not shown). In the substrate 100, the wiring layer 120 is formed in the Low-k layer 130. The liner layer 110 is formed below the wiring layer 120 so as to be adjacent to the wiring layer 120. A barrier layer may be formed below the liner layer 110 so as to be adjacent to the liner layer 110. Dual damascene is a method in which: a via and a trench are formed; a metal is embedded in the via and trench at the same time by film forming; and then excess volume is removed by polishing, thus embedding wiring in the via and the trench at the same time.

In the substrate 100, the first metal atom-containing layer may be the liner layer 110 or the wiring layer 120. When the first metal atom-containing layer is the liner layer 110, the second metal atom-containing layer is the wiring layer 120. When the first metal atom-containing layer is the wiring layer 120, the second metal atom-containing layer is the liner layer 110. Materials for forming the liner layer 110 and the wiring layer 120 may for example be those of the substrate 1 in FIG. 1A. If the substrate 100 has the barrier layer, the liner layer 110 may be omitted. A material for forming the barrier layer may for example be that of the substrate F in FIG. 1B.

In the substrate 100, the via 140 is formed on the wiring layer 120. The wiring layer 120 is exposed, while the liner layer 110 is not exposed.

However, in a via formation process, a misalignment of the via may occur, so that the liner layer 110 may be exposed as in the substrate 100' illustrated in FIG. 2B. When the liner layer 110 and the wiring layer 120 are exposed as in the substrate 100' and are cleaned with a conventional cleaning solution, galvanic corrosion occurs at the interface between the liner layer 110 and the wiring layer 120 due to the corrosion potential difference between the cobalt contained in the first metal atom-containing layer and the non-cobalt metal contained in the second metal atom-containing layer. On the other hand, in the cleaning solution according to the present embodiment, the corrosion potential difference between the cobalt and the non-cobalt metal is reduced, so that the occurrence of galvanic corrosion is suppressed (However, the mechanism and effect according to the present embodiment are not limited thereto.).

In the cleaning after the via formation, not only the wiring layer 120 but also the liner layer 110 may possibly be exposed due to misalignment of the via. By using the cleaning solution according to the present embodiment, the occurrence of galvanic corrosion can be suppressed even if the via is misaligned.

On the substrate after the CMP or via formation, an impurity such as a metal shaving and the like generated by these steps is adhered. Such a metal shaving contains a metal or metal oxide. For example, if a substrate includes a copper wiring layer, an impurity contains copper oxide ($CuO_x$). By using the cleaning solution according to the present embodiment, such an impurity can be efficiently removed from the substrate surface.

According to the cleaning solution of the present embodiment, by containing a hydrazine compound (A) and a basic compound (B), it can suppress the occurrence of galvanic corrosion and efficiently remove a residue such as a metal and/or metal oxide derived from the first metal atom-containing layer and the second metal atom-containing layer (residue generated in steps such as dry etching, CMP, and the like) even in a cleaning of a substrate in which cobalt and a non-cobalt metal are present in contact. Although the mechanism is not certain, in the cleaning solution according to the present embodiment, the hydrazine compound (A) suppresses an increase in the corrosion potential of cobalt, and the difference in corrosion potential with respect to the non-cobalt metal can be reduced. It is considered that the occurrence of galvanic corrosion is thereby suppressed. In addition, it is considered that by containing the component (B), the pH of the cleaning solution is maintained appropriately, and cleanability for the above-mentioned residue (in particular, metal oxide residue) can also be maintained at a high level without deterioration.

Method for Cleaning a Substrate

The cleaning solution according to the present embodiment can be used for cleaning a substrate. A preferred example of such a method for cleaning a substrate may be a method for cleaning a substrate, which includes a step of cleaning the substrate using the above cleaning solution, the substrate having a region in which a first metal atom-containing layer containing a cobalt atom and a second metal atom-containing layer containing a copper atom are in contact with each other, and at least one of the first metal atom-containing layer and the second metal atom-containing layer being exposed on a surface of the substrate.

The above substrate includes a wiring layer, and the wiring layer may be the first metal atom-containing layer or second metal atom-containing layer described above. The first metal atom-containing layer and the second metal atom-containing layer may be those described above when appropriate.

The above substrate includes a wiring layer, and the first metal atom-containing layer may be a copper-containing wiring layer, and the second metal atom-containing layer may be a barrier layer or a liner layer.

The step is a step in which a substrate is cleaned with a processing solution according to a first aspect. The step includes an operation for bringing the cleaning solution into contact with the substrate. A method for implementing the method for cleaning the substrate is not particularly limited, and a known cleaning method can be used. Examples of the cleaning method may include a method of continuously discharging a cleaning solution to a substrate rotating at a constant speed (single wafer cleaning method), a method of immersing a substrate in a cleaning solution for a certain time (dipping method), a method of spraying a cleaning solution on a substrate surface (spraying method), and the like.

A temperature at which the cleaning processing is performed is not particularly limited. For example, the temperature of the cleaning processing may be from 15 to 60° C. Although the cleaning performance is improved by increasing the temperature of the processing solution, the temperature of the cleaning solution can be appropriately selected in consideration of suppressing a change in the composition of the cleaning solution to a low level, workability, safety, cost, and the like.

Cleaning time can be appropriately selected so as to be sufficient for removing an impurity, a residue, and the like on a substrate surface. For example, the cleaning time may be from 10 seconds to 30 minutes, from 10 seconds to 15 minutes, from 10 seconds to 10 minutes, or from 10 seconds to 5 minutes.

The cleaning solution may be diluted 2 to 2000 times to obtain a diluted solution at the time of use. In this step, the substrate may be cleaned using the diluted solution.

Substrate

A substrate to be cleaned may be the substrate described above. For example, the substrate may be a substrate after CMP of a wiring layer (for example, FIGS. 1A and 1B). The substrate may be a substrate after formation of a via connected to a wiring layer by a dual damascene process (for example, FIGS. 2A and 2B).

Optional Step

The method of the present embodiment may include an optional step in addition to the above cleaning step. Examples of the optional step may include a CMP step, a via formation step, a contact formation step, and the like.

(CMP Step)

The method of the present embodiment may include a CMP step prior to the cleaning step described above. The CMP step is a step for applying CMP processing to a substrate. By performing the CMP step, a surface of the substrate is flattened. The CMP step can be performed after a liner layer and a wiring layer are formed on a substrate to flatten the wiring layer.

For example, a Low-k layer is formed on a substrate, and a trench and a via are formed in the Low-k layer. Next, a liner layer is formed, and then a wiring layer is formed. Subsequently, the surface of the substrate is flattened by CMP. On the substrate after the CMP, a shaving containing a metal oxide derived from the first and/or second metal atom-containing layers, etc. is adhered. By performing the above cleaning step, the shaving can be removed while suppressing the occurrence of galvanic corrosion.

(Via Formation Step)

The method of the present embodiment may include a via formation step prior to the cleaning step described above. A via can be formed, for example, so as to connect to a wiring layer. The via formation may be performed by a dual damascene process.

For example, a Low-k layer is formed on a substrate on which a liner layer and a wiring layer have been formed. For example, an etch stop layer containing SiCN, SiCO, $Al_2O_3$, or the like may have been formed below the Low-k layer. Next, a via is formed in the Low-k layer so as to connect to the wiring layer. The via can be formed, for example, by dry etching, wet etching, or the like. On the substrate after the via formation, a metal oxide and the like derived from the first and/or second metal atom-containing layers as well as an etching residue and the like derived from the etch stop layer or the Low-k layer are adhered. By performing the above cleaning step, shavings (residues) can be removed while suppressing the occurrence of galvanic corrosion.

In the via formation step, a trench may be formed together with the via. The above cleaning step may be performed on the substrate after the formation of the via and trench in the dual damascene process.

According to the method of the present embodiment, a substrate is cleaned using the above cleaning solution. Therefore, even if cobalt and a non-cobalt metal are adjacent to each other, the corrosion potential difference between the two metals can be reduced, so that the occurrence of galvanic corrosion is suppressed, and good washability can be maintained.

In addition, after the processing with the cleaning solution, the substrate can be rinsed, as necessary. For example, the substrate (or semiconductor device) may be rinsed using at least one selected from the group consisting of methanol, isopropanol, ethylene glycol, water, a mixture of water and a surfactant, and a mixture thereof. After the rinsing, it can be dried by nitrogen gas, spin drying cycle, steam drying, or the like.

Method for Manufacturing a Semiconductor

The method for cleaning the substrate according to the present embodiment can be used in a method for manufacturing a semiconductor. A preferred example of the method for manufacturing the semiconductor may be a method for manufacturing a semiconductor, which includes a step of preparing a substrate that has a region in which a first metal atom-containing layer containing a cobalt atom and a second metal atom-containing layer containing a copper atom are in contact with each other, at least one of the first metal atom-containing layer and the second metal atom-containing layer being exposed on a surface of the substrate; and a step of cleaning the substrate with the above-described cleaning solution.

The substrate, first metal atom-containing layer, and second metal atom-containing layer in the method for manufacturing the semiconductor may be those described above when appropriate.

As described above, the cleaning solution according to the present embodiment has excellent anti-corrosion properties for a substrate on which a metal layer is formed, and also has excellent residue removal properties for a residue generated after etching. For example, regarding the anti-corrosion properties, although a substrate with a structure in which copper (Cu) and cobalt (Co) contact with each other tends to cause galvanic corrosion, etc., the cleaning solution according to the present embodiment can exhibit excellent anti-corrosion properties even for such a substrate. In addition, regarding the residue removal properties, the cleaning solution according to the present embodiment can efficiently remove not only a residue generated from the substrate and metal layer (metal oxide residue) but also a residue generated from a resist (resist residue). Furthermore, even if the cleaning solution according to the present embodiment is used after etching or ashing, it is expected to maintain high levels of the anti-corrosion properties and residue removal properties.

Additionally, conventional cleaning solutions include cleaning solutions in which a chelating agent is formulated from the viewpoint of improving residue removal properties, etc. Even if such cleaning solutions formulated with a chelating agent can obtain a certain effect on residue removal properties, there exist cleaning solutions which are insufficient against corrosion such as galvanic corrosion. However, the cleaning solution according to the present embodiment can surprisingly avoid such a defect by containing the above-described predetermined components and achieve both anti-corrosion properties and residue removal properties at high levels.

Further, the cleaning solution according to the present embodiment can be, for example, a processing solution containing only water as a solvent, or a processing solution containing only water and an aqueous organic solvent as a solvent. Thus, since the processing solution according to the present embodiment can be an aqueous processing solution, it can reduce an environmental load and can be expected to be efficiently distilled from a processed substrate (semiconductor device) in a subsequent rinsing step and the like. Furthermore, the cleaning solution according to the present embodiment can also be used in a form that does not contain a metal ion (metal-free processing solution).

EXAMPLES

The present invention will be described in more detail with reference to the following Examples and Comparative examples, but the present invention is not limited in any way to the following examples. Unless otherwise specified below, quantities are based on mass, and experiments were conducted under conditions of 25° C. and atmospheric pressure.

Preparation of Cleaning Solution

Examples and Comparative Examples

Each component shown in the tables was dissolved in water to prepare a cleaning solution for each example. The content of each hydrate in the tables (for example, "hydrazine monohydrate" of Comparative example 2, etc.) is a numerical value of the active ingredient excluding the hydrate.

The abbreviations in the tables are as follows:

AEEA: 2-(2-aminoethylamino)ethanol

5MBTA: 5-methyl-1H-benzotriazole

BTA: benzotriazole

TEAH: tetraethylammonium hydroxide

TMHA: tetramethylammonium hydroxide

Solfit (product name "Solfit", manufactured by Kuraray Co., Ltd., alcohol-based solvent): 3-methoxy-3-methyl-1-butanol Evaluation of SEM Evaluation (Anti-Corrosion Properties)

Anti-corrosion properties were evaluated by SEM evaluation. As a substrate, a 12-inch silicon substrate on which a cobalt film (5 nm) and a copper film (25 nm) were formed by a PVD method was used. Then, the substrate was cut into a size of 1.0×1.5 cm to prepare coupons as test pieces.

Each coupon was then immersed in a 100 mL beaker containing 70 mL of the cleaning solution of each Example and Comparative example at room temperature for 3 minutes. After the immersion, the coupons were taken out, washed with IPA (isopropyl alcohol), and dried by nitrogen blowing.

Then, the coupons were imaged with a scanning electron microscope (SEM, manufactured by Hitachi, Ltd., "SEM S-5200", imaging magnification: 150,000 times), and the anti-corrosion properties were evaluated for an imaging area of 84 m×63 m according to the following criteria.

Evaluation Criteria:

A: Metal corrosion (corrosion of the part where dissimilar metals are in contact) was not confirmed.

B: Metal corrosion (corrosion of the part where dissimilar metals are in contact) was not confirmed, but roughness of an extent that the substrate is practical was confirmed on the substrate surface.

C: Metal corrosion (corrosion of the part where dissimilar metals are in contact) was confirmed.

Evaluation of Etching Rate (Cleanability)

The cleanability was evaluated as $CuO_x$ etching rate. As a substrate, an 8-inch silicon substrate on which a copper film (30 nm) was formed by a PVD method was used. Then, the substrate was cut into a size of 1.5×1.5 cm to prepare coupons as test pieces.

The substrate was then immersed in a 5% by mass hydrogen peroxide solution for 10 minutes at room temperature. This processing oxidized copper to copper oxide ($CuO_x$). Next, the substrate was taken out, washed with water, and dried by nitrogen blowing. Thereafter, each coupon was then immersed in a 100 mL beaker containing 70 mL of the cleaning solution of each Example and Comparative example at room temperature. After the immersion of 3 minutes, the coupons were taken out, washed with water, and dried by nitrogen blowing. The copper film thickness before the hydrogen peroxide processing and after the cleaning step were measured by X-ray electron spectroscopy (XPS) using an X-ray electron spectrometer ("Primus IV", manufactured by Rigaku Corporation). The amount of reduction in copper film thickness due to the cleaning step was calculated and shown in the tables as $CuO_x$ etching rate ("ER": A/min).

TABLE 1

| | Reducing agent | | Amine | | Anticorrosive agent | |
|---|---|---|---|---|---|---|
| Example | Kind | Concentration % | Kind | Concentration % | Kind | Concentration % |
| 1 | 2-Hydrazino-ethanol | 0.15% | AEEA | 0.30% | 5MBTA | 0.05% |
| 2 | 2-Hydrazino-ethanol | 0.35% | AEEA | 0.30% | 5MBTA | 0.05% |
| 3 | 2-Hydrazino-ethanol | 0.50% | AEEA | 0.30% | 5MBTA | 0.05% |
| 4 | 2-Hydrazino-ethanol | 0.16% | AEEA | 0.50% | 5MBTA | 0.01% |
| 5 | 2-Hydrazino-ethanol | 0.16% | AEEA | 0.50% | 5MBTA | 0.01% |
| 6 | 2-Hydrazino-ethanol | 0.16% | AEEA | 0.50% | 5MBTA | 0.01% |
| 7 | Bis (pinacolato) diboron | 0.10% | Diethylene-triamine | 0.25% | BTA | 0.05% |
| 8 | Hydrazine | 0.10% | Triethanolamine | 0.20% | Triazole | 0.01% |
| 9 | Hydrazine | 0.10% | Triethanolamine | 0.20% | Triazole | 0.01% |
| 10 | Hydrogen iodide | 0.15% | Diethylene-triamine | 0.30% | 5MBTA | 0.05% |

| | pH adjuster | | Others | | | SEM | ER |
|---|---|---|---|---|---|---|---|
| Example | Kind | Concentration % | Kind | Concentration % | pH | evaluation | (A/min) |
| 1 | — | | — | | 10.31 | A | 16.0 |
| 2 | — | | — | | 10.57 | B | 13.0 |
| 3 | — | | — | | 10.55 | A | 13.9 |
| 4 | Acetic acid | 0.10% | — | | 9.98 | A | 16.9 |

TABLE 1-continued

| | | | | | | | |
|---|---|---|---|---|---|---|---|
| 5 | Acetic acid | 0.24% | — | | 9.09 | A | 15.7 |
| 6 | Acetic acid | 0.27% | — | | 8.08 | A | 11.5 |
| 7 | — | | Solfit. | 5.00% | 10.17 | A | 22.3 |
| 8 | — | | — | | 9.75 | A | 11.7 |
| 9 | TMAH | 0.09% | — | | 11.85 | A | 14.8 |
| 10 | — | | — | | 10.01 | A | 21.4 |

TABLE 2

| | Reducing agent | | Amine | | Anticorrosive agent | | pH adjuster |
|---|---|---|---|---|---|---|---|
| Example | Kind | Concentration % | Kind | Concentration % | Kind | Concentration % | Kind |
| 11 | 2-Hydrazino-ethanol | 0.01% | AEEA | 0.30% | 5MBTA | 0.05% | — |
| 12 | 2-Hydrazino-ethanol | 0.05% | AEEA | 0.30% | 5MBTA | 0.05% | — |
| 13 | 2-Hydrazino-ethanol | 1.00% | AEEA | 0.30% | 5MBTA | 0.05% | — |
| 14 | 2-Hydrazino-ethanol | 2.70% | AEEA | 0.30% | 5MBTA | 0.05% | — |
| 15 | 2-Hydrazino-ethanol | 6.00% | AEEA | 0.30% | 5MBTA | 0.05% | — |

| | pH adjuster | Others | | | SEM | ER |
|---|---|---|---|---|---|---|
| Example | Concentration % | Kind | Concentration % | pH | evaluation | (A/min) |
| 11 | | — | | 10.33 | A | 14.5 |
| 12 | | — | | 10.42 | A | 17.8 |
| 13 | | — | | 10.60 | B | 14.5 |
| 14 | | — | | 10.44 | B | 12 |
| 15 | | — | | 10.58 | B | 13.1 |

TABLE 3

| | Reducing agent | | Amine | | Anticorrosive agent | | pH adjuster |
|---|---|---|---|---|---|---|---|
| Example | Kind | Concentration % | Kind | Concentration % | Kind | Concentration % | Kind |
| 16 | 2-Hydrazino-ethanol | 0.16% | AEEA | 0.30% | 5MBTA | 0.10% | — |
| 17 | 2-Hydrazino-ethanol | 0.50% | AEEA | 0.30% | 5MBTA | 0.004% | — |
| 18 | 2-Hydrazino-ethanol | 0.58% | AEEA | 0.30% | 5MBTA | 0.01% | — |
| 19 | 2-Hydrazino-ethanol | 0.50% | AEEA | 0.30% | Octyl phosphinic acid | 0.05% | — |
| 20 | 2-Hydrazino-ethanol | 0.50% | AEEA | 0.30% | Phenyl phosphinic acid | 0.05% | — |
| 21 | 2-Hydrazino-ethanol | 0.50% | AEEA | 0.30% | Octyl phosphonic acid | 0.05% | — |
| 22 | 2-Hydrazino-ethanol | 0.50% | AEEA | 0.30% | Thioglycerol | 0.05% | — |
| 23 | 2-Hydrazino-ethanol | 0.50% | N-methyl diethanolamine | 1.00% | 5MBTA | 0.05% | — |
| 24 | 2-Hydrazino-ethanol | 0.509% | AEEA | 0.30% | 5MBTA | 0.05% | TEAH |
| 25 | 2-Hydrazino-ethanol | 0.50% | Tetramethyl ammonium acetate | 1.00% | 5MBTA | 0.05% | — |

TABLE 3-continued

| Example | pH adjuster Concentration % | Others Kind | Others Concentration % | pH | SEM evaluation | ER (A/min) |
|---|---|---|---|---|---|---|
| 16 | | | | 10.24 | A | 15.6 |
| 17 | | — | | 11.03 | B | 18.1 |
| 18 | | — | | 10.92 | B | 16.6 |
| 19 | | — | | 10.41 | A | 29.2 |
| 20 | | — | | 10.37 | A | 21.2 |
| 21 | | — | | 10.27 | A | 22.7 |
| 22 | | — | | 10.01 | A | 19.6 |
| 23 | | — | | 9.78 | A | 10.8 |
| 24 | 0.10% | — | | 11.48 | A | 15.9 |
| 25 | | — | | 8.74 | A | 11.1 |

TABLE 4

| Comparative example | Reducing agent Kind | Reducing agent Concentration % | Amine Kind | Amine Concentration % | Anticorrosive agent Kind | Anticorrosive agent Concentration % | pH adjuster Kind |
|---|---|---|---|---|---|---|---|
| 1 | 2-Hydrazino-ethanol | 0.10% | — | | — | | — |
| 2 | Hydrazine | 0.10% | — | | — | | — |
| 3 | — | | AEEA | 0.30% | — | | — |
| 4 | 2-Hydrazino-ethanol | 0.10% | AEEA | 0.30% | — | | — |
| 5 | — | | AEEA | 0.50% | 5MBTA | 0.01% | — |
| 6 | Bis(pinacolato) diboron | 0.05% | Diethylene-triamine | 0.08% | — | | — |
| 7 | Bis(pinacolato) diboron | 0.10% | Diethylene-triamine | 0.05% | — | | Acetic acid |

| Comparative example | pH adjuster Concentration % | Others Kind | Others Concentration % | pH | SEM evaluation | (A/min) ER |
|---|---|---|---|---|---|---|
| 1 | | — | | 9.82 | — | 8.1 |
| 2 | | — | | 9.68 | — | 4.8 |
| 3 | | — | | 11.25 | C | 42.2 |
| 4 | | — | | 11.23 | C | 15.2 |
| 5 | | — | | 11.14 | C | 20.8 |
| 6 | | Solfit | 5.00% | 10.34 | C | 27.7 |
| 7 | 0.03% | Solfit | 5.00% | 7.46 | C | 21.3 |

From the above, it was at least confirmed that the cleaning solutions according to the Examples each have both anti-corrosion properties and residue removal properties maintained at high levels.

EXPLANATION OF REFERENCE SIGNS

1, 1', 100, 100': Substrate
10, 110: Liner layer
11: Barrier layer
20, 120: Wiring layer
30, 130: Low-k layer
140: Via
150: Trench

What is claimed is:

1. A cleaning solution, comprising:

at least one compound (A) selected from the group consisting of a compound a1 represented by a general formula (a1), a salt of the compound a1, a hydrate of the compound a1, hydrogen iodide, borane, and a complex of the borane;

an amine compound comprising 4 or more carbon atoms that is not the compound a1, or a salt thereof (B); and an anticorrosive agent (C), wherein the cleaning solution does not comprise an alkylamine comprising 1 to 3 carbon atoms, a hydroxylamine, tris(2-hydroxyethyl)methylammonium hydroxide (THEMAH), cetyl trimethylammonium hydroxide (CTAH), or choline, (a1)

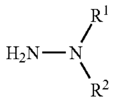

wherein $R^1$ and $R^2$ each independently represents an organic group that does not comprise a carbonyl group, or a hydrogen atom.

2. The cleaning solution according to claim 1, wherein the compound (A) comprises at least one selected from the group consisting of:

a compound represented by the general formula (a1), wherein $R^1$ and $R^2$ are each independently a hydrogen atom or an alkyl group, a salt thereof, or a hydrate thereof;

a compound represented by the general formula (a1), wherein $R^1$ is a hydrogen atom, and $R^2$ is —$R^3$OH, in which $R^3$ represents an alkylene group comprising 2 or more carbon atoms, a salt thereof, or a hydrate thereof;

hydrogen iodide; and bis(pinacolato)diboron.

3. The cleaning solution according to claim 1, wherein the amine compound (B) comprises at least one selected from the group consisting of:

$H_2N$—$R^4$—NH—$R^5$—OH, in which $R^4$ and $R^5$ each independently represents an alkylene group comprising 2 or more carbon atoms;

$H_2N$—$R^6$—NH—$R^7$—$NH_2$, in which $R^6$ and $R^7$ each independently represents an alkylene group comprising 2 or more carbon atoms;

HO—$R^8$—N(—$R^9$—OH)—$R^{10}$—OH, in which $R^8$, $R^9$ and $R^{10}$ each independently represents an alkylene group comprising 2 or more carbon atoms;

a tertiary amine; and a quaternary amine.

4. The cleaning solution according to claim 1, wherein the anticorrosive agent (C) comprises at least one selected from the group consisting of an imidazole ring-containing compound, a triazole ring-containing compound, a pyridine ring-containing compound, a pyrimidine ring-containing compound, a tetrazole ring-containing compound, a pyrazole ring-containing compound, a purine ring-containing compound, a phenanthroline ring-containing compound, a thiol-containing compound, a phosphonic acid-containing compound, and a phosphinic acid-containing compound.

5. The cleaning solution according to claim 1, wherein the cleaning solution is for cleaning a substrate that has a region in which a first metal atom-containing layer comprising a cobalt atom and a second metal atom-containing layer comprising a copper atom are in contact with each other, and at least one of the first metal atom-containing layer and the second metal atom-containing layer are exposed on a surface of the substrate.

6. The cleaning solution according to claim 1, wherein a mass ratio of the content of the compound (A) and the content of the amine compound or a salt thereof (B) is from 20:1 to 1:30.

7. The cleaning solution according to claim 1, wherein a mass ratio of the content of the compound (A) and the content of the anticorrosive agent (C) is from 1:5 to 150:1.

8. A method for cleaning a substrate, comprising:

cleaning the substrate using the cleaning solution according to claim 1, wherein the substrate has a region in which a first metal atom-containing layer comprising a cobalt atom and a second metal atom-containing layer comprising a copper atom are in contact with each other, and at least one of the first metal atom-containing layer and the second metal atom-containing layer are exposed on a surface of the substrate.

9. The method according to claim 8, wherein the substrate comprises a wiring layer, and the wiring layer is the first metal atom-containing layer or the second metal atom-containing layer.

10. The method according to claim 8, wherein the substrate comprises a wiring layer, and the first metal atom-containing layer is a copper-containing wiring layer, and the second metal atom-containing layer is a barrier layer or a liner layer.

11. A method for manufacturing a semiconductor, comprising:

preparing a substrate having a region in which a first metal atom-containing layer comprising a cobalt atom and a second metal atom-containing layer comprising a copper atom are in contact with each other, at least one of the first metal atom-containing layer and the second metal atom-containing layer are exposed on a surface of the substrate; and cleaning the substrate using the cleaning solution according to claim 1.

12. The cleaning solution according to claim 1, wherein the cleaning solution does not comprise a hydrazide compound.

13. The cleaning solution according to claim 1, wherein the cleaning solution does not comprise a water-soluble organic solvent.

* * * * *